United States Patent [19]

Tokumaru et al.

[11] Patent Number: 5,059,830

[45] Date of Patent: Oct. 22, 1991

[54] INTEGRATED CIRCUIT USING BUS DRIVER HAVING REDUCED AREA

[75] Inventors: Takeji Tokumaru, Yokohama; Tsuneaki Kudou, Kawasaki; Kazuyuki Omote, Yokohama, all of Japan

[73] Assignee: Kabushiki Kaisha Toshiba, Kawasaki, Japan

[21] Appl. No.: 435,932

[22] Filed: Nov. 14, 1989

[30] Foreign Application Priority Data

Nov. 14, 1988 [JP] Japan .................................. 63-285809

[51] Int. Cl.$^5$ ..................... H03K 19/02; H03K 19/096
[52] U.S. Cl. ..................................... 307/481; 307/443; 307/451; 307/304; 307/480
[58] Field of Search ........ 307/443, 448, 451, 480–481, 307/304

[56] References Cited

U.S. PATENT DOCUMENTS 4,920,282   4/1990   Muraoka et al. ..................... 307/481

Primary Examiner—Stanley D. Miller
Assistant Examiner—Margaret Rose Wambach
Attorney, Agent, or Firm—Foley & Lardner

[57] ABSTRACT

A bus driver in which at least two P channel MOS transistors and at least two N channel MOS transistors are employed and these are respectively connected in series. A data signal is inputted into a gate of one of the P channel MOS transistors, an inverted input of an enable signal is inputted into a gate of the other of the P channel MOS transistors, the enable signal is inputted into a gate of one of the N channel MOS transistors and the data signal is also inputted into a gate of the other of the N channel MOS transistors. Further, an output signal is outputted from a connection point of the P channel MOS transistors and the N channel MOS transistors. Also disclosed is another embodiment of a bus driver in which an inverted signal of an enable signal is inputted into the other of the P channel MOS transistors through an inverter.

3 Claims, 6 Drawing Sheets

INTEGRATED CIRCUIT USING BUS DRIVER HAVING REDUCED AREA

BACKGROUND OF THE INVENTION

1. Field of the Invention

The present invention relates to a bus driver integrated circuit for driving a bus, and particularly to a bus driver integrated circuit having a reduced integrated circuit area.

2. Description of the Prior Art

Generally, a bus driver which is used for bus driving in a microprocessor has sufficient driving ability for driving heavily loaded wiring. FIG. 1 is a compositional diagram of a bus driver 100 which is conventionally used. The bus driver 100 is so arranged that an enable signal E and a data signal A are inputted to input terminals of a NAND gate 101 and a NOR gate 102 respectively. Further, the enable signal E is also inputted to the NOR gate 102 through an inverter 103. An output terminal of the NAND gate 101 is connected to a gate electrode of a P channel MOS transistor (PMOS transistor) $P_1$. The output terminal of the NOR gate 102 is connected to a gate electrode of an N channel MOS transistor (NMOS transistor) $N_1$, and an output Z is obtained from a connection point of transistors $P_1$ and $N_1$. Reference character $V_{DD}$ designates a power source.

Accordingly, an output of the NAND gate 101 becomes 0 only when A is 1 and E is 1, and $P_1$ becomes ON. While, an output of the NOR gate 102 becomes 1 only when A is 0 and E is 1, and $N_1$ becomes ON. Thus, the bus driving is performed.

FIG. 2 is a compositional diagram of a bus driver system 200 in which is employed the bus driver 100. In the same diagram, the bus driver system 200 is used for an internal bus having relatively small wiring load. In the diagram, reference numerals 201, 202, 203, 204, 205, ..., IN are respectively composed of the bus drivers 100, and these drive main buses 0, 1, ..., n respectively.

More specifically, these bus drivers are respectively composed of the NAND gates 101, NOR gates 102 and inverters 103.

However, in the internal bus system having relatively small wiring load as shown in the same diagram, since the bus drivers 201, 202, 203, 204, 205, ..., $I_n$ respectively use bus drivers which are used for a bus system having large wiring load, it is difficult to reduce an area of a bus driver integrated circuit which employs such a bus driver system. Accordingly, an entire and actual pattern area of the integrated circuit becomes inevitably large.

SUMMARY OF THE INVENTION

It is an object of the present invention to provide a bus driver integrated circuit having a reduced actual pattern area.

To achieve the object, in the present invention, a bus driver integrated circuit has a plurality of bus drivers for controlling output into a main bus and an internal bus which is connected to the main bus. Further, the respective bus drivers are composed of clocked inverters comprising at last two P channel MOS transistors and at least two N channel MOS transistors so that data outputs are outputted into the internal bus in accordance with the presence of enable signals.

Namely, since these clocked inverters are not composed of NAND gates and NOR gates, a simple integrated circuit can be realized.

Accordingly, an area required for arrangement of these compositional elements in the integrated circuit can be reduced as compared with conventional circuits. Moreover, the gate delay caused on the bus drivers themselves can be also reduced.

These and other objects, features and advantages of the present invention will be more apparent from the following description of preferred embodiments, taken in conjunction with the accompanying drawings.

DETAILED DESCRIPTION OF THE PREFERRED EMBODIMENTS

Figure 1:
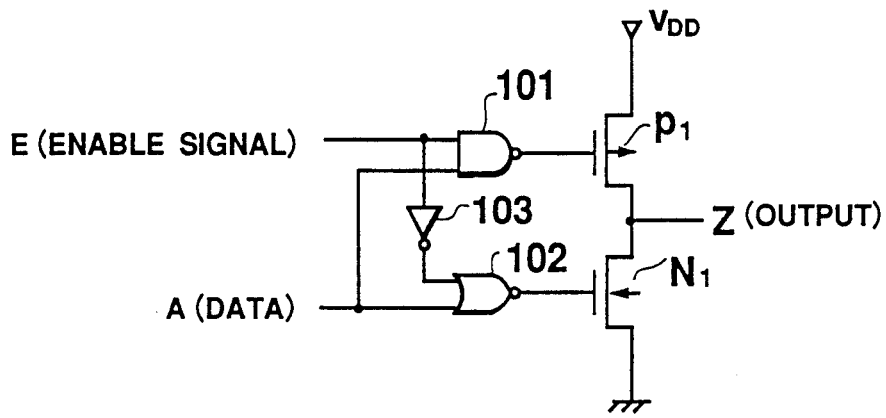
FIG. 1 is a compositional diagram of a bus driver which is conventionally used.
Figure 2:
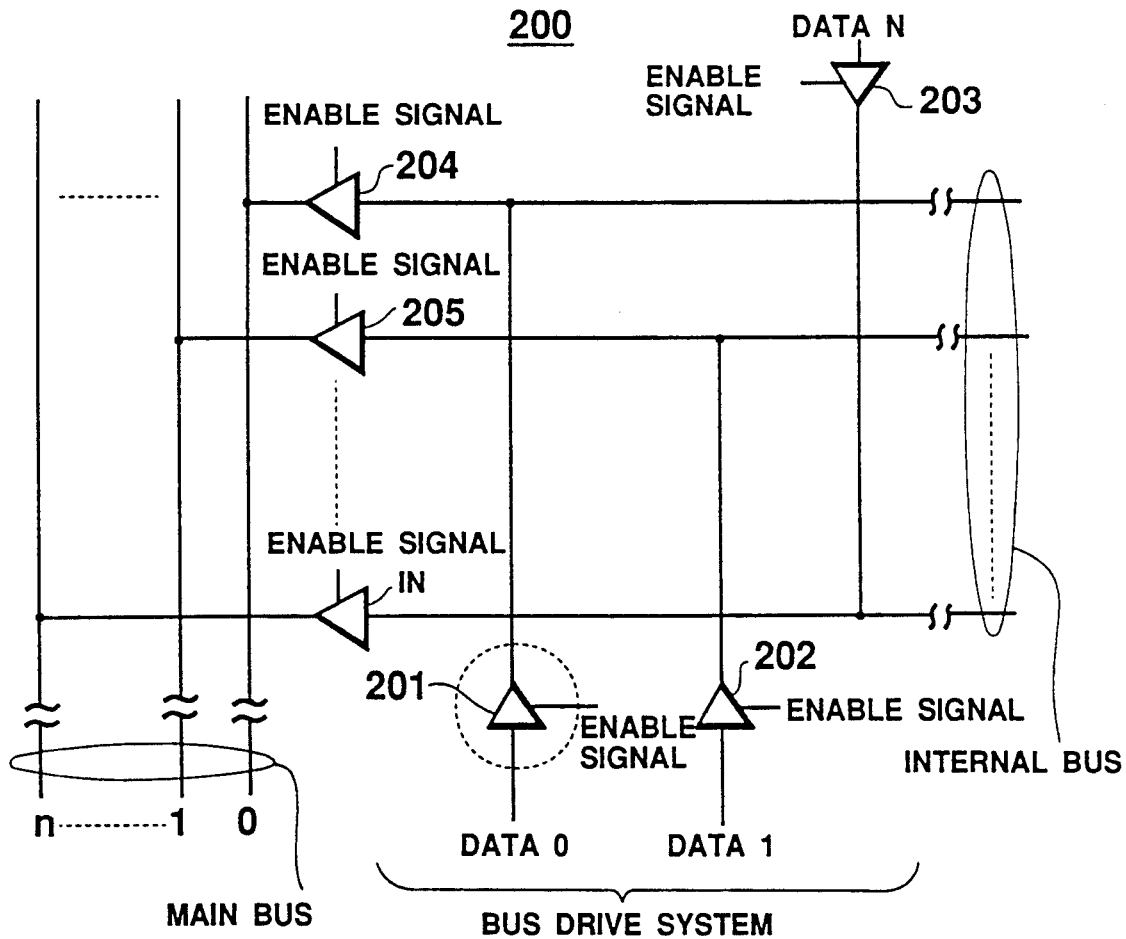
FIG. 2 is a compositional diagram of an internal bus system using the bus driver shown in FIG. 1.
Figure 3:
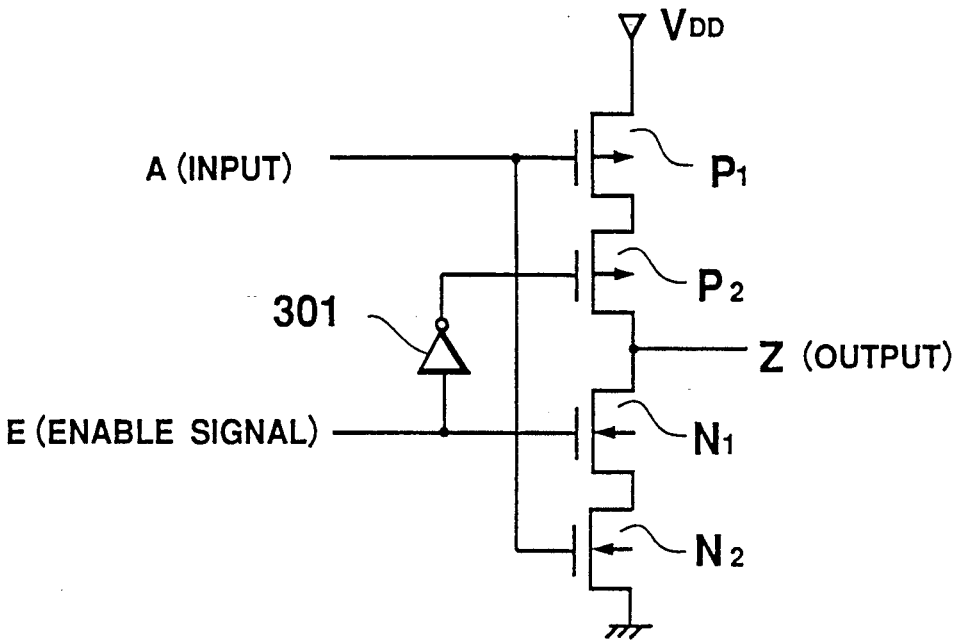
FIG. 3 is a compositional diagram of a bus driver or clocked inverter which is an embodiment of the present invention.

FIG. 3 is a compositional diagram of a bus driver which is an embodiment of the present invention. A first and a second P channel MOS transistor $P_1$, $P_2$ and a first and a second N channel MOS transistor $N_1$, $N_2$ are connected in series respectively, and a data signal or input A is supplied to a gate electrode of the first PMOS transistor $P_1$ and a gate electrode of the second NMOS transistor $N_2$, and an enable signal or input E and an inverted input $\overline{E}$ obtained by inversion of the input E through an inverter 301 are respectively supplied to a gate electrode of the second PMOS transistor $P_2$. Moreover, an output Z is obtained from a connection point of the second PMOS transistor $P_2$ and the first NMOS transistor $N_1$.

Hereinafter, operation of the bus driver having the above mentioned composition of the present invention will be described.

When A is 1 and E is 1, the transistors $N_1$ and $N_2$ become ON, and the transistor $P_1$ becomes OFF, and $P_2$ becomes ON. When A is 0 and E is 1, $P_1$, $P_2$ and $N_1$ become ON, and only $N_2$ becomes OFF. While, when A is 1 and E is 0, $P_1$, $P_2$ and $N_1$ become OFF, and only $N_2$ becomes ON. Further, when A is 0 and E is 0, only $P_1$ becomes ON and the others become OFF.

By the above-mentioned operation, the bus driver of this embodiment drives a main bus and an internal bus.

Figure 4:
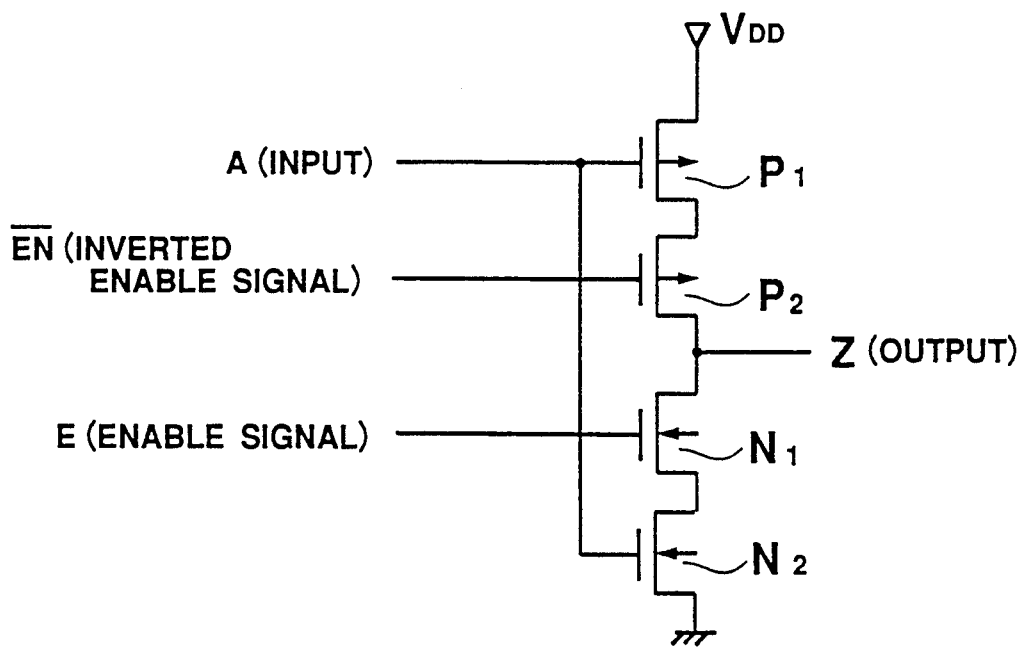
FIG. 4 is a compositional diagram of a bus driver or clocked inverter which is another embodiment of the present invention.

FIG. 4 is a compositional diagram of a bus driver which is another embodiment of the present invention. The bus driver or clocked inverter 400 has a composition in which the inverter 301 in the embodiment shown in FIG. 3 is removed, and an inverted enable signal $\overline{EN}$ of the enable signal E is directly inputted. In operation of the clocked inverter 400, only the MOS transistor $P_2$ is on-off controlled in accordance with a low or high level of the inverted enable signal $\overline{EN}$ of the enable signal E. Since respective operation of the other transistors $P_1$, $N_1$ and $N_2$ are the same as those in the case of the bus driver 300 shown in FIG. 3, explanations on them are omitted herein.

Figure 5:
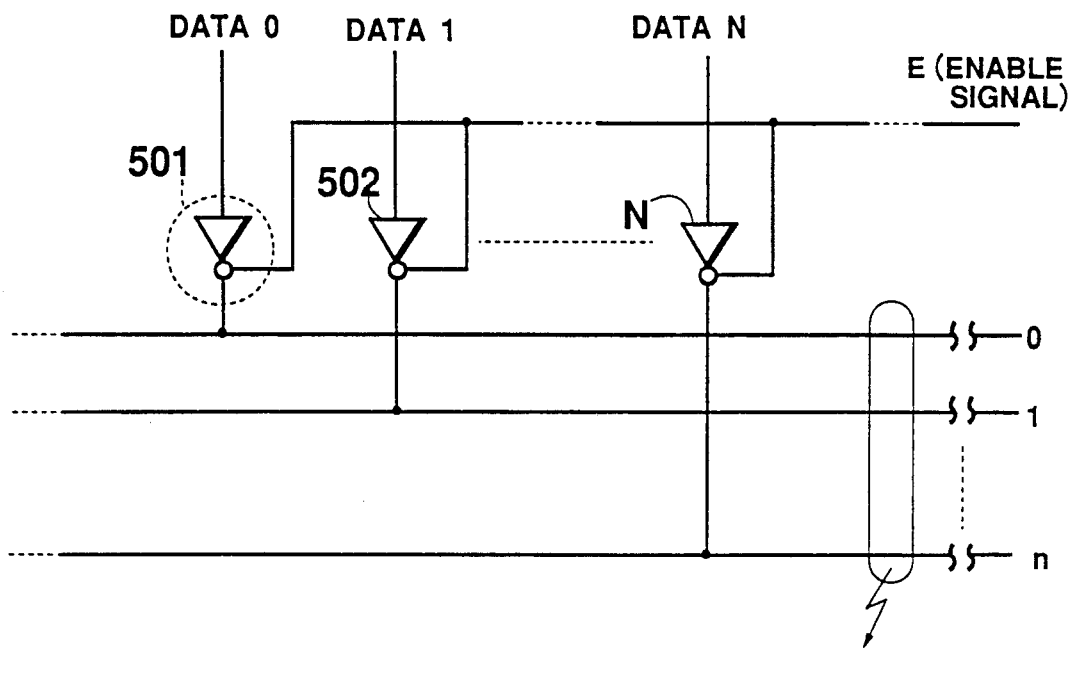
FIG. 5 is a compositional diagram of an internal bus system using the clocked inverter shown in FIG. 3.

FIG. 5 is a compositional diagram of an internal bus system 500 using the bus driver 300 of the embodiment shown in FIG. 3.

In the embodiment, bus drivers 501, 502, ..., N are respectively composed of the clocked inverters 300. Therefore the gate delay caused on the bus drivers 501, 502, ..., N themselves can be also reduced. In operation of the internal bus system 500, when data DATA 0, DATA 1, DATA 2, DATA N are respectively inputted into the clocked inverters 501, 502, ..., N, internal buses 0, 1, ..., n are respectively driven corresponding to control of the enable signal E.

Figure 6:
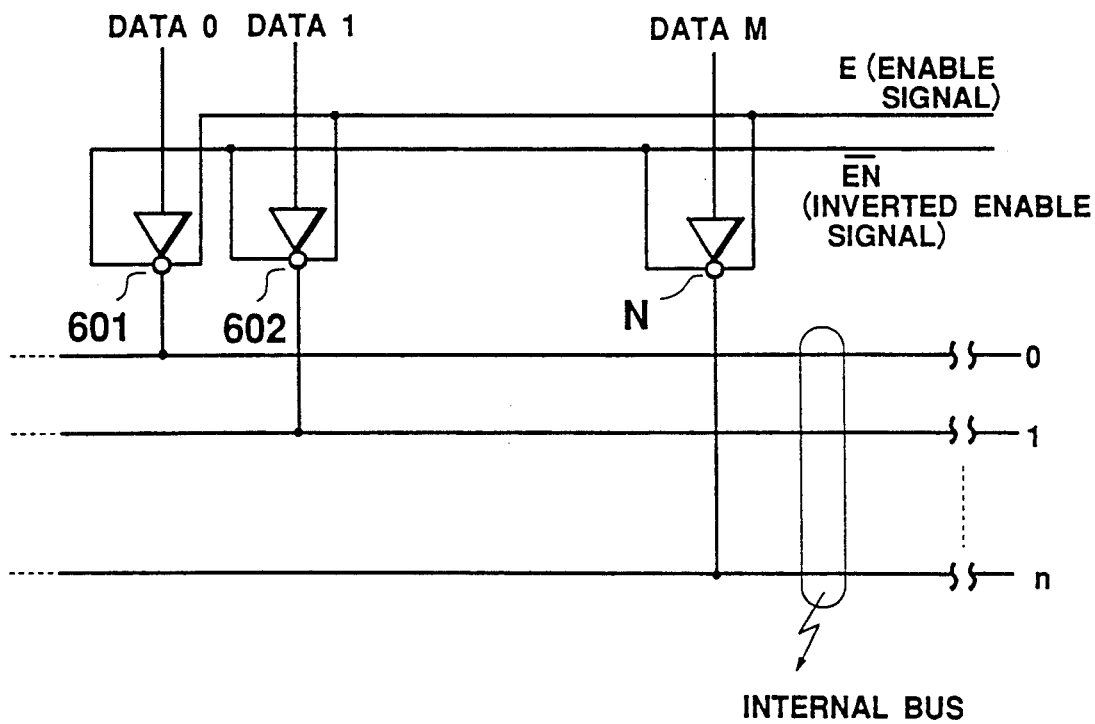
FIG. 6 is a compositional diagram of an internal bus system using the clocked inverter shown in FIG. 4.

FIG. 6 is a compositional diagram of an internal bus system 600 using the bus driver 400 of the embodiment shown in FIG. 4.

In the same diagram, bus drivers 601, 602, ..., N are respectively composed of the clocked inverters 400. In operation of the internal bus system 600, when data DATA 0, DATA 1, DATA 2, ..., DATA N are respectively inputted, internal buses 0, 1, N ..., N are respectively driven corresponding to control of the enable signal E and the inverted enable signal $\overline{EN}$. Since the operation is very similar to the embodiment of FIG. 5, it is not described in detail herein.

Figure 7:
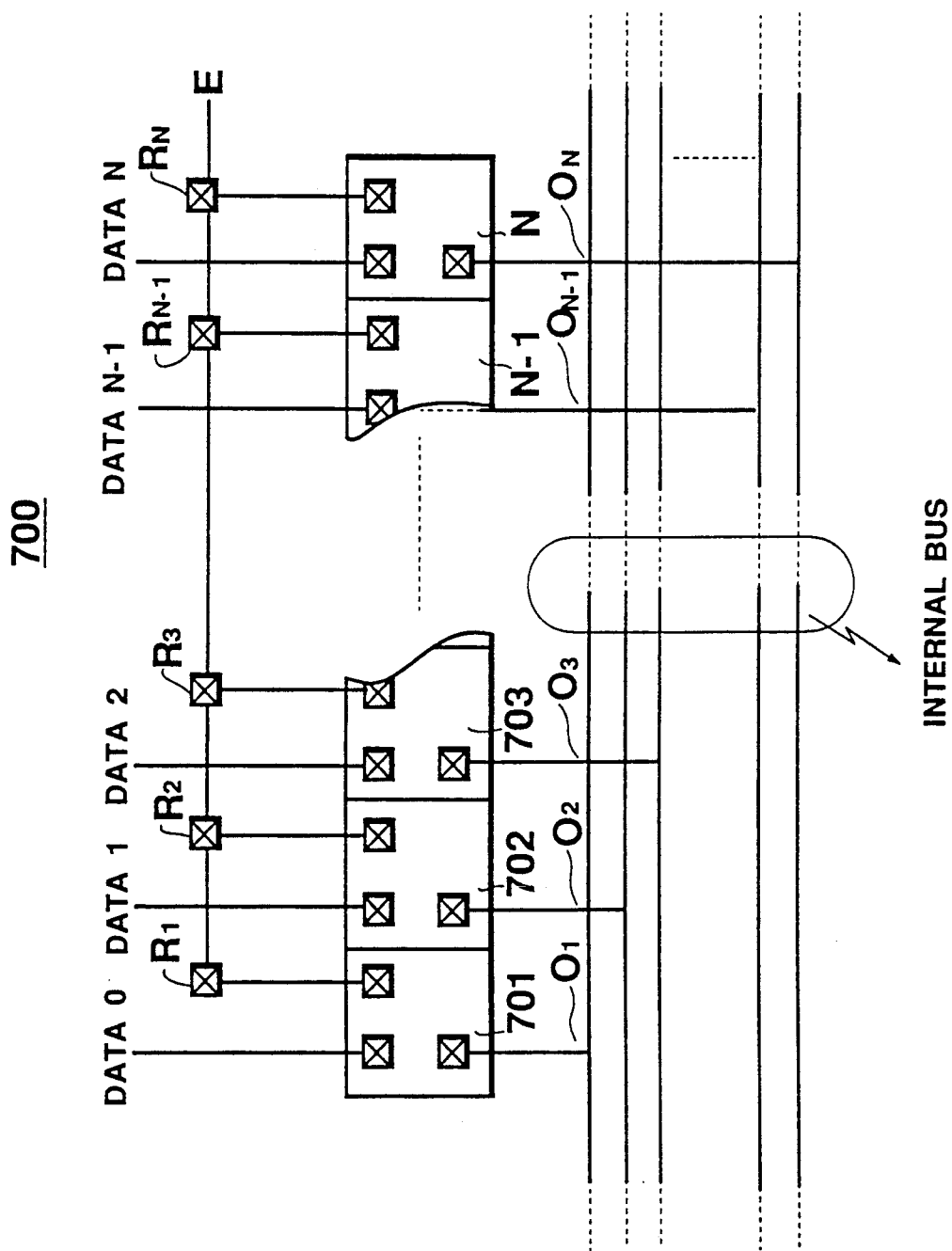
FIG. 7 is a diagram to show the internal bus system shown in FIG. 5 at an actual pattern level.

FIG. 7 shows an example in which the internal bus system shown in FIG. 5 is formed in an actual pattern on an integrated circuit. In the same diagram, reference numerals 701, 702, 703, ..., N respectively designate but drivers, and reference characters $R_1$, $R_2$, $R_3$, ..., $R_N$ respectively designate trunk terminals, further $O_1$, $O_2$, $O_3$, ..., $O_N$ are output lines of the respective bus drivers.

Figure 8:
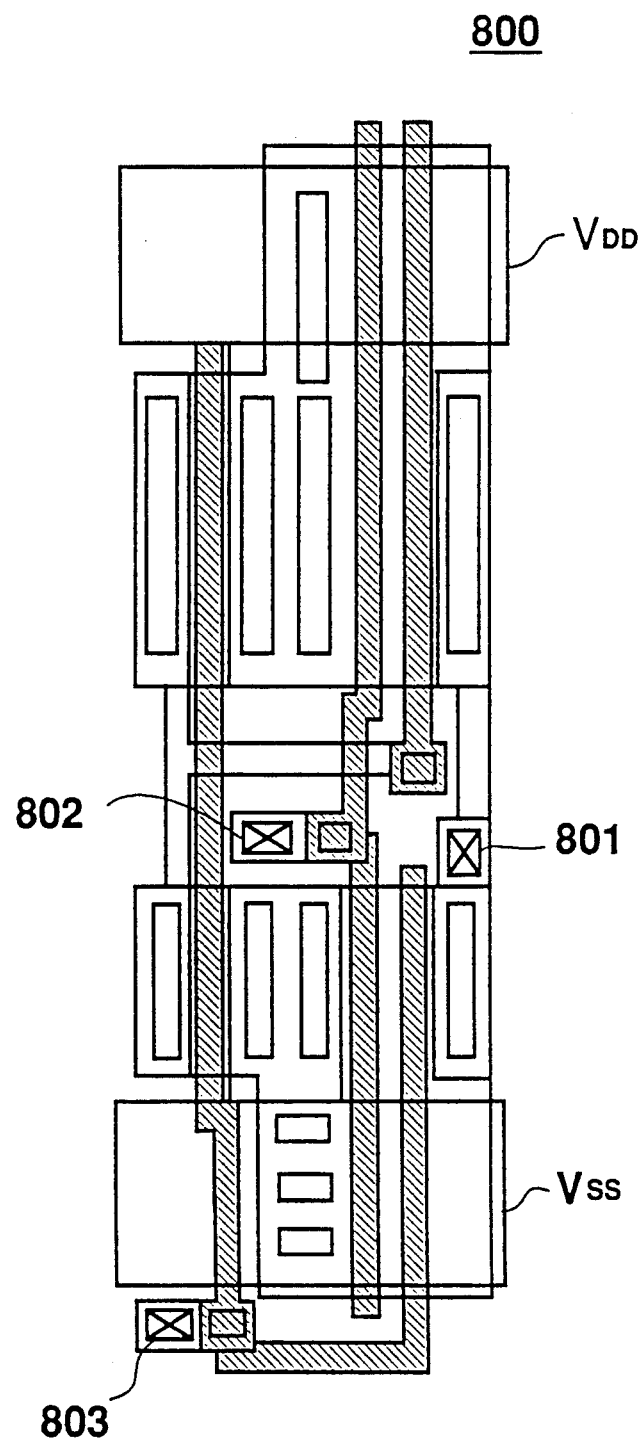
FIG. 8 is an example of an actual pattern of an integrated circuit of the bus driver shown in FIG. 3.

FIG. 8 shows an example of a pattern of an actual integrated circuit which comprises mounting the clocked inverter 300 shown in FIG. 3 on a chip.

In the same diagram, reference characters $V_{SS}$, $V_{DD}$ designate power source terminals, and reference numeral 801 designates a terminal for output of the output Z of the clocked inverter 300, and 802 and 803 respectively designate a terminal for input of the data A and a terminal for input of the enable signal E.

Figure 9:
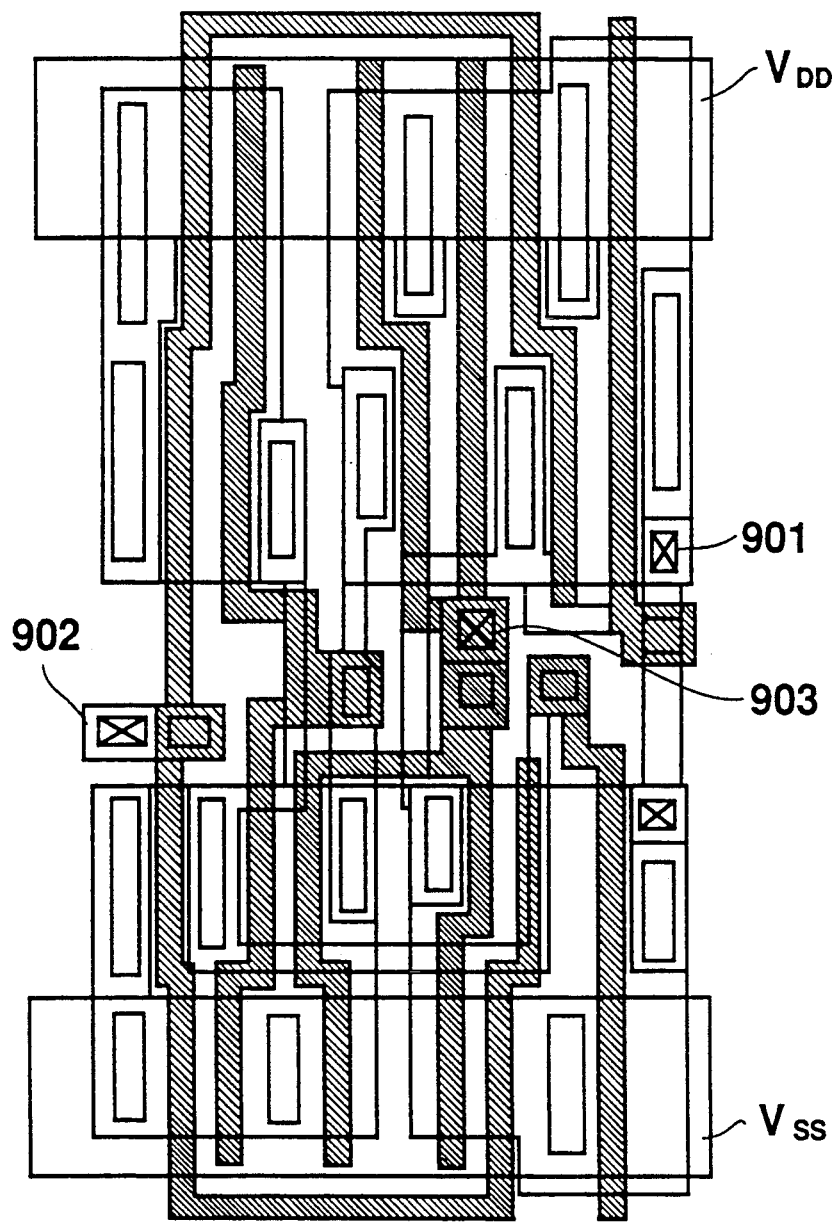
FIG. 9 is an example of an actual pattern of an integrated circuit of the bus driver shown in FIG. 1.

FIG. 9 shows an example of a pattern of an actual integrated circuit which comprises mounting the conventional bus driver 100 on a chip.

In the same diagram, reference characters $V_{SS}$, $V_{DD}$ designate power source terminals, and reference numeral 901 designates a terminal for output of the output Z of the bus driver 100, and 902 and 903 respectively designate a terminal for input of the data A and a terminal for input of the enable signal E.

In comparison of these actual patterns shown in FIGS. 8 and 9, it can be apparently seen that an area required for the bus driver 300 of the present invention is reduced into about a half of that in the conventional one.

Various modifications will become possible for those skilled in the are after receiving the teachings of the present disclosure without departing from the scope thereof.

What is claimed is:

1. An integrated circuit bus driver for driving bus lines, the bus driver including a clocked inverter having two P channel MOS transistors and two N channel MOS transistors connected to one another in series, each bus driver having a data input terminal, a control terminal for inputting an enable signal, and an output terminal, comprising:
    a plurality of bus drivers each having an output terminal;
    a plurality of first bus lines for transferring data among the components of the integrated circuit; and
    a plurality of second bus lines, for transferring data among the components of the integrated circuit, each of which are respectively coupled to the first bus lines;
    wherein the output terminal of each bus driver is connected to one of the second bus lines.

2. A n integrated circuit according to claim 1, wherein the first bus lines are main bus lines, the second bus lines are internal bus lines, the internal bus lines being formed in a plurality of hierarchies, each of which comprises a plurality of internal bus lines, the bus drivers being used at least in one or more internal bus lines.

3. An integrated circuit according to claim 1, wherein the first bus lines are main bus lines, the second bus lines are internal bus lines and the bus drivers are used in the internal bus lines.

* * * * *